US008281739B2

United States Patent
Tiner et al.

(10) Patent No.: US 8,281,739 B2
(45) Date of Patent: Oct. 9, 2012

(54) RF SHUTTER

(75) Inventors: Robin L. Tiner, Santa Cruz, CA (US);
Gaku Furuta, Sunnyvale, CA (US);
Yukinobu Adachi, Osaka (JP)

(73) Assignee: Applied Materials, Inc., Santa Clara, CA (US)

( * ) Notice: Subject to any disclaimer, the term of this patent is extended or adjusted under 35 U.S.C. 154(b) by 866 days.

(21) Appl. No.: 12/040,298

(22) Filed: Feb. 29, 2008

(65) Prior Publication Data

US 2008/0286463 A1 Nov. 20, 2008

Related U.S. Application Data

(60) Provisional application No. 60/892,447, filed on Mar. 1, 2007.

(51) Int. Cl.
*C23C 16/00* (2006.01)
*H01L 21/00* (2006.01)

(52) U.S. Cl. .................................................. 118/723 R

(58) Field of Classification Search ............... 118/723 R, 118/723 E; 156/345.43, 345.44, 345.45, 156/345.46, 345.47; 315/111.21
See application file for complete search history.

(56) References Cited

U.S. PATENT DOCUMENTS

| | | | |
|---|---|---|---|
| 6,221,202 B1 * | 4/2001 | Walko, II | 156/345.43 |
| 6,355,108 B1 * | 3/2002 | Won et al. | 118/728 |
| 6,396,620 B1 | 5/2002 | Goodwin-Johansson | |
| 6,663,714 B2 * | 12/2003 | Mizuno et al. | 118/719 |
| 6,779,481 B2 * | 8/2004 | Kent et al. | 118/723 R |
| 6,953,740 B2 | 10/2005 | Schaff et al. | |
| 2005/0167052 A1 * | 8/2005 | Ishihara et al. | 156/345.47 |
| 2006/0060302 A1 * | 3/2006 | White et al. | 156/345.28 |
| 2006/0130764 A1 | 6/2006 | Quan | |
| 2006/0286776 A1 | 12/2006 | Ranish et al. | |
| 2008/0274297 A1 * | 11/2008 | Furuta et al. | 427/569 |
| 2009/0064934 A1 * | 3/2009 | Park et al. | 118/723 R |
| 2009/0107955 A1 * | 4/2009 | Tiner et al. | 216/67 |

OTHER PUBLICATIONS

Office Action for Chinese Patent Application No. 200880009630.8 dated Dec. 30, 2010.
International Search Report and Written Opinion dated Aug. 4, 2008 for International Application No. PCT/US2008/55438.
Office Action for Chinese Patent Application No. 200880009630.8 dated Aug. 19, 2010.
Office Action for Chinese Patent Application No. 200880009630.8 dated May 27, 2011.

* cited by examiner

*Primary Examiner* — Ram Kackar
*Assistant Examiner* — Anna Crowell
(74) *Attorney, Agent, or Firm* — Patterson & Sheridan, LLP

(57) ABSTRACT

The present invention generally comprises an RF shutter assembly for use in a plasma processing apparatus. The RF shutter assembly may reduce the amount of plasma creep below the substrate and shadow frame during processing, thereby reducing the amount of deposition that occurs on undesired surfaces. By reducing the amount of deposition on undesired surfaces, particle flaking and thus, substrate contamination may be reduced.

12 Claims, 7 Drawing Sheets

RF SHUTTER

CROSS-REFERENCE TO RELATED APPLICATIONS

This application claims benefit of U.S. Provisional Patent Application Ser. No. 60/892,447, filed Mar. 1, 2007, entitled "RF Shutter", which is herein incorporated by reference.

BACKGROUND OF THE INVENTION

1. Field of the Invention

Embodiments of the present invention generally relate to an RF shutter for reducing the amount of deposition occurring below a substrate pedestal.

2. Description of the Related Art

In plasma processing, a substrate may be exposed to a plasma to perform a process on the substrate. Such process may include deposition, etching, ion implantation, and post deposition treatment. In one such plasma deposition process, plasma enhanced chemical vapor deposition (PECVD), an RF bias may be applied to a showerhead to generate a plasma and/or further excite a remotely generated plasma between the showerhead and the substrate support. In plasma deposition processes, deposition may occur within the chamber at all locations exposed to the plasma. A certain amount of deposition on the chamber surfaces is acceptable provided that the material deposited onto the chamber surfaces does not dislodge or flake off and potentially contaminate the substrate. Once a tolerance level of deposition on the chamber surfaces has been reached, the chamber surfaces may be cleaned or replaced to reduce the likelihood of particle flaking.

Flaking may occur due to any number of reasons. One reason for flaking is that too much material has deposited onto a surface and thus, may flake off due to bombardment with ions in the plasma. Another reason for flaking is movement of chamber components. When a component of the chamber is moved, such as a substrate support raising a substrate into a processing position, the movement of the component may jar components having material deposited thereon. The jarring may cause material to flake off of the components. Therefore, there is a need in the art to prevent undesired flaking in a plasma processing chamber.

SUMMARY OF THE INVENTION

The present invention generally relates to an RF shutter assembly for use in a plasma processing apparatus. The RF shutter assembly may reduce the amount of plasma creep below the substrate and shadow frame during processing, thereby reducing the amount of deposition that occurs on undesired surfaces. By reducing the amount of deposition on undesired surfaces, particle flaking and thus, substrate contamination may be reduced.

In one embodiment, a processing apparatus is disclosed. The apparatus comprises a chamber body having an interior defined by a plurality of walls. An opening may be present within a first wall of the plurality of walls for passing one or more substrates therethrough. The opening may extend a first distance along the first wall. One or more RF shutters may be coupled with one or more walls. The one or more RF shutters may be disposed above the opening and extend a second distance at least fifty percent as long as the first distance.

In another embodiment, a plasma enhanced chemical vapor deposition apparatus is disclosed. The apparatus comprises a process chamber having a plurality of walls. An opening may be disposed in a first wall of the plurality of walls and extend a first distance along the first wall. One or more RF shutters may be disposed above the opening within the process chamber. The one or more shutters may be coupled with the first wall and extend a second distance at least about fifty percent of the first distance.

In still another embodiment, a plasma processing apparatus is disclosed. The apparatus comprises a chamber body having at least a first wall and at least one opening for passage of at least one substrate therethrough. An RF shutter structure circumscribing the chamber body above the at least one opening may also be present. The RF shutter structure comprises a plurality of protrusions disposed along the first wall. The plurality of protrusions collectively span a distance along the first wall that is at least about fifty percent of the length of the at least one opening.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally relates to an RF shutter assembly for use in a plasma processing apparatus. The RF shutter assembly may reduce the amount of plasma creep below the substrate and shadow frame during processing, thereby reducing the amount of deposition that occurs on undesired surfaces. By reducing the amount of deposition on undesired surfaces, particle flaking and thus, substrate contamination may be reduced.

Figure 1:
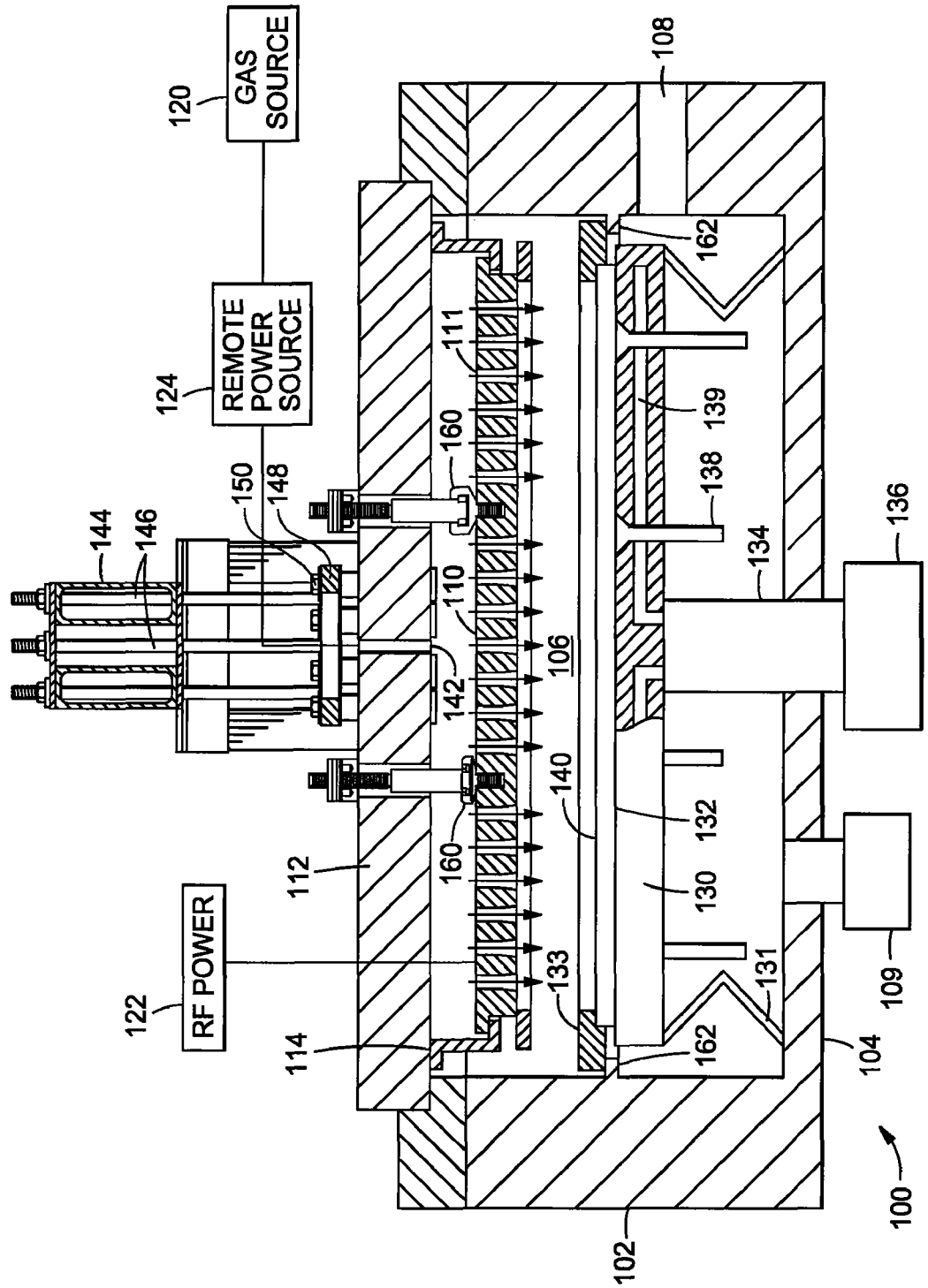
FIG. 1 is a cross sectional view of a processing chamber having an RF shutter according to one embodiment of the invention.

FIG. 1 is a cross sectional view of a PECVD apparatus according to one embodiment of the invention. The apparatus includes a chamber 100 in which one or more films may be deposited onto a substrate 140. As shown in FIG. 1, the substrate is in a lowered position where processing may not occur. One suitable PECVD apparatus which may be used is available from AKT, a subsidiary of Applied Materials, Inc., located in Santa Clara, Calif. While the description below will be made in reference to a PECVD apparatus, it is to be understood that the invention is equally applicable to other plasma processing chambers such as a physical vapor deposition (PVD) chamber, including those made by other manufacturers. The apparatus may be used to process one or more substrates including semiconductor substrates, flat panel display substrates, and solar panel substrates.

The chamber 100 generally includes walls 102, a bottom 104, a showerhead 110, and substrate support 130 which define a process volume 106. The process volume 106 is accessed through a valve 108 such that the substrate 140 may be transferred in and out of the chamber 100. The substrate support 130 includes a substrate receiving surface 132 for supporting a substrate 140. One or more stems 134 may be coupled to a lift system 136 to raise and lower the substrate support 130. Lift pins 138 are moveably disposed through the substrate support 130 to move a substrate 140 to and from the substrate receiving surface 132. The substrate support 130 may also include heating and/or cooling elements 139 to maintain the substrate support 130 at a desired temperature. The substrate support 130 may also include grounding straps 131 to provide RF grounding at the periphery of the substrate support 130.

The showerhead 110 may be coupled to a backing plate 112 at its periphery by a suspension 114. The showerhead 110 may also be coupled to the backing plate 112 by one or more coupling supports 160 to help prevent sag and/or control the straightness/curvature of the showerhead 110. In one embodiment, twelve coupling supports 160 may be used to couple the showerhead 110 to the backing plate 112. The coupling supports 160 may include a fastening mechanism such as a nut and bolt assembly. In one embodiment, the nut and bolt assembly may be made with an electrically insulating material. In another embodiment, the bolt may be made of a metal and surrounded by an electrically insulating material. In still another embodiment, the showerhead 110 may be threaded to receive the bolt. In yet another embodiment, the nut may be formed of an electrically insulating material. The electrically insulating material helps to prevent the coupling supports 160 from becoming electrically coupled to any plasma that may be present in the chamber. Additionally and/or alternatively, a center coupling mechanism may be present to couple the backing plate 112 to the showerhead 110. The center coupling mechanism may surround the ring 148 (discussed below) and be suspended from a bridge assembly. In still another embodiment, the coupling supports 160 may comprise a fastener threaded into the showerhead 110. The fastener may have a slotted opening for receiving a rod that is coupled to the backing plate 112. The rod may be coupled to the backing plate 112 with a vacuum seal.

A gas source 120 may be coupled to the backing plate 112 to provide gas through a gas outlet 142 in the backing plate 112 and through gas passages 111 in the showerhead 110 to the substrate receiving surface 132. A vacuum pump 109 may be coupled to the chamber 100 to control the process volume 106 at a desired pressure. An RF power source 122 is coupled to the backing plate 112 and/or to the showerhead 110 to provide an RF power to the showerhead 110. The RF power creates an electric field between the showerhead 112 and the substrate support 130 so that a plasma may be generated from the gases between the showerhead 110 and the substrate support 130. Various frequencies may be used, such as a frequency between about 0.3 MHz and about 200 MHz. In one embodiment, the RF power source is provided at a frequency of 13.56 MHz.

A remote plasma source 124, such as an inductively coupled remote plasma source, may also be coupled between the gas source 120 and the backing plate 112. Between processing substrates, a cleaning gas may be provided to the remote plasma source 124 so that a remote plasma is generated and provided to clean chamber components. The cleaning gas may be further excited by the RF power source 122 provided to the showerhead. Suitable cleaning gases include but are not limited to $NF_3$, $F_2$, and $SF_6$.

The spacing between the top surface of the substrate 140 disposed on the substrate receiving surface 132 and the showerhead 110 may be between about 400 mil and about 1,200 mil. In one embodiment, the spacing may be between about 400 mil and about 800 mil.

The backing plate 112 may be supported by a bridge assembly 144. One or more anchor bolts 146 may extend down from the bridge assembly 144 to a support ring 148. The support ring 148 may be coupled with the backing plate 112 by one or more bolts 150. The support ring 148 may be coupled with the backing plate 112 substantially in the center of the backing plate 112. The center of the backing plate 112 is the area of the backing plate 112 with the least amount of support in absence of the support ring 148. Therefore, supporting the center area of the backing plate 112 may reduce and/or prevent sagging of the backing plate.

In one embodiment, the support ring 148 may be coupled to an actuator that controls the shape of the backing plate 112 so that the center of the backing plate 112 may be raised or lowered relative to the edges of the backing plate 112. It is contemplated that by raising the center area of the backing plate, a vortex-like flow may be created to enable atomic layer deposition processes to be performed on large area substrates. The movement of the backing plate 112 may occur in response to a metric obtained during processing. In one embodiment, the metric is the thickness of the layer being deposited. The movement of the backing plate 112 may occur simultaneous with the processing.

The support ring 148 may be integral with or separate from the supporting mechanism for the showerhead 110. In one embodiment, one or more supporting elements may couple the showerhead 110 to the backing plate 112 at various locations while the support ring 148 is coupled to a center area of the backing plate 112. In another embodiment, a center mounted coupling mechanism may be used to couple the backing plate 112 to the showerhead 110 while the support ring 148 is coupled to the center area of the backing plate 112. When the showerhead 110 is center supported in addition to the support ring 148 of the backing plate 112, the support ring 148 of the backing plate 112 may be disposed within the center support for the showerhead 110.

A shadow frame 133 may be optionally placed over the periphery of the substrate 140. The shadow frame 133 may rest on an RF shutter 162 when the substrate support 130 is lowered. In one embodiment, the RF shutter 162 may comprise the same material as the chamber. In another embodiment, the RF shutter may comprise a dielectric material. In another embodiment, the RF shutter 162 may comprise stainless steel. In another embodiment, the RF shutter 162 may comprise aluminum. The shadow frame 133 may reduce deposition at the edge of the substrate 140 and on areas of the substrate support 130 that are not covered by the substrate 140. When the substrate 140 is initially inserted into the chamber, the shadow frame 133 may rest on the RF shutter 162. When the substrate support 130 raises to the processing position the shadow frame 133 may be raised by the substrate 140 and substrate support 130 off of the RF shutter 162.

During processing, the RF shutter 162 may help reduce plasma creep. Plasma creep is where the plasma spreads to areas below the substrate support 130. Wherever the plasma creeps, deposition may occur. The RF shutter 162 may extend from the walls 102 of the chamber 100 to not only provide support for the shadow frame 133 when the shadow frame is not coupled to the substrate 140 and substrate support 130, but also may alter the path of the plasma as it creeps through the chamber 100. By altering the flow of the plasma, the amount of plasma creep may be reduced.

The RF shutter 162 may block and/or alter the path of the plasma and any processing gas not yet ignited into a plasma. The plasma and/or processing gas may be prevented from entering the slit valve opening. Because the plasma and/or processing gas may not enter the slit valve opening, less material may deposit within the opening and flake off during chamber expansion, chamber contraction, substrate insertion, or substrate removal.

While not shown in the drawings, a chamber liner may also be present. A chamber liner may be used to reduce deposition on the chamber walls during plasma processing. A chamber liner may be removed and then cleaned and/or replaced in order to reduce the amount of flaking in the chamber. By removing the chamber liner, a clean chamber liner may be immediately disposed in the chamber while the removed chamber liner is either cleaned or recycled. In one embodiment, the RF shutter 162 may be integrated with a chamber liner and thus, removed with the chamber liner. In another embodiment, the RF shutter 162 may be disposed through the chamber liner. By disposing the RF shutter 162 through the chamber liner, the RF shutter 162 may be uncoupled from the chamber liner prior to removal of the chamber liner. Alternatively, the chamber liner may be multiple pieces that do not necessitate removal of the RF shutter 162 prior to removal of the liner.

Figure 2:
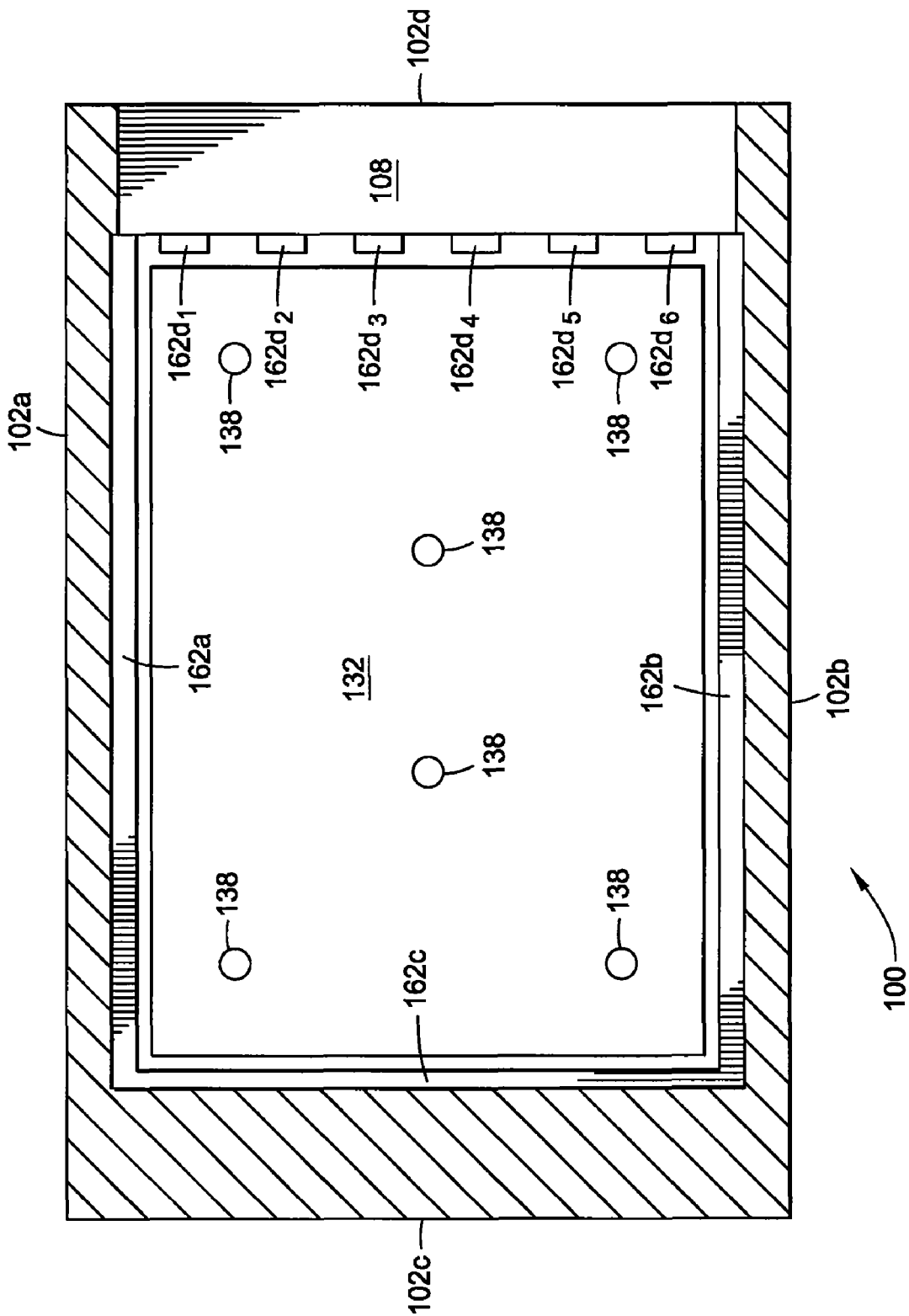
FIG. 2 is a top view of the RF shutter of FIG. 1.

FIG. 2 is a top view of the RF shutter 162 of FIG. 1. The top of the chamber 100, substrate 140, and shadow frame 133 have been removed for clarity. The chamber 100 may comprise four walls 102a, 102b, 102c, 102d. An RF shutter 162 may be present on each of the walls 102a, 102b, 102c, 102d. For the walls 102a, 102b, 102c where no opening 108 is present, the RF shutters 162a, 162b, 162c may comprise one continuous piece of material. The RF shutters 162a, 162b, 162c may be separate pieces coupled with the walls 102a, 102b, 102c. In one embodiment, the RF shutters 162a, 162b, 162c may collectively be a unitary piece of material. In another embodiment, the walls 102a, 102b, 102c and the RF shutters 162a, 162b, 162c may comprise a unitary piece of material.

Figure 3:
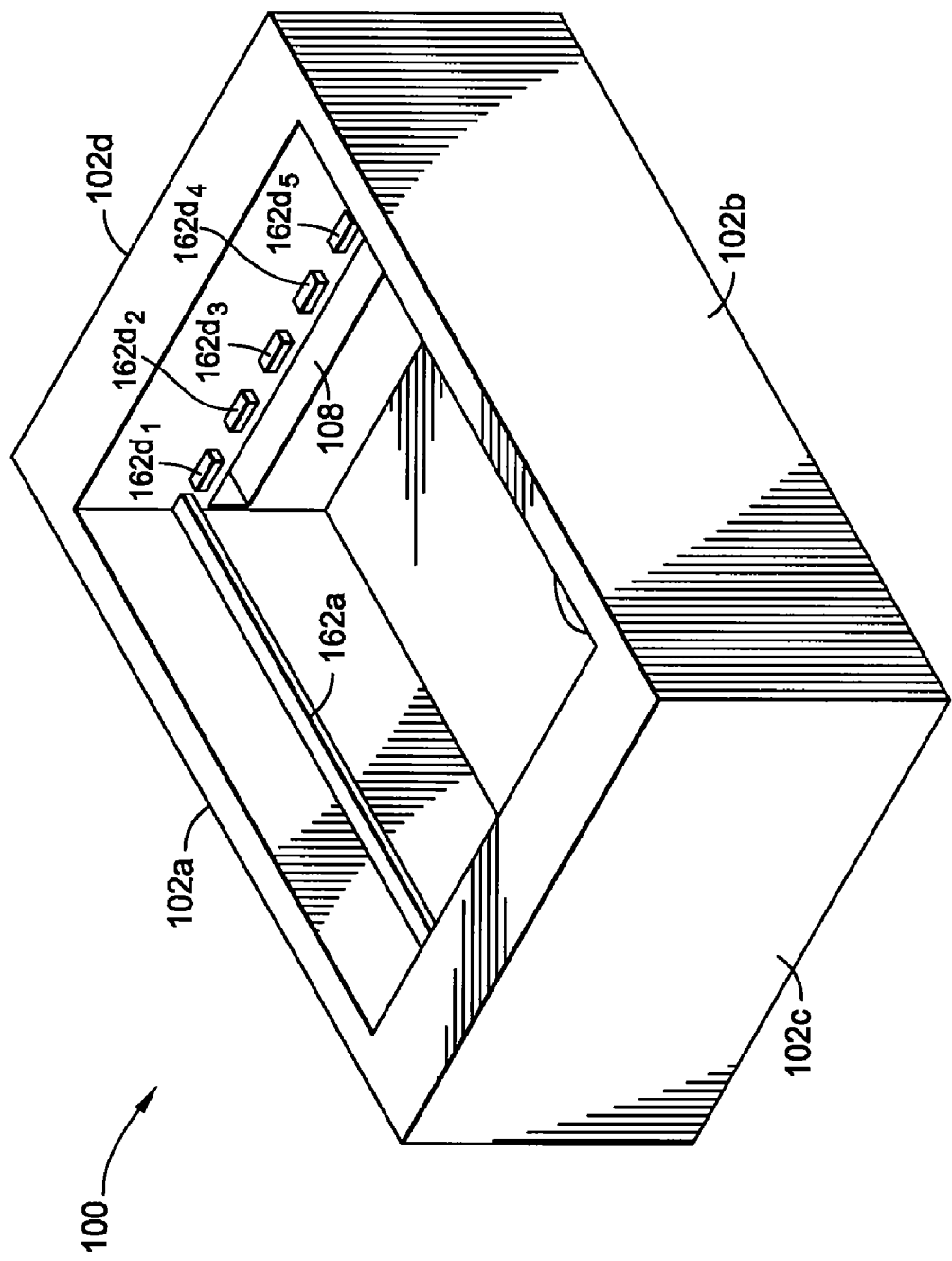
FIG. 3 is a perspective view of the RF shutter of FIG. 2.

Along the wall 102d having an opening 108, the RF shutter 162 may comprise one or more RF shutter pieces $162d_1$, $162d_2$, $162d_3$, $162d_4$, $162d_5$, $162d_6$. It is to be understood that while six RF shutter pieces $162d_1$, $162d_2$, $162d_3$, $162d_4$, $162d_5$, $162d_6$ have been shown, more or less RF shutter pieces may be present. FIG. 3 is a perspective view of the RF shutter of FIG. 2 showing the RF shutter pieces $162d_1$, $162d_2$, $162d_3$, $162d_4$, $162d_5$, disposed above the opening 108. The opening 108 extends across the wall 102d in a first direction. The RF shutter pieces $162d_1$, $162d_2$, $162d_3$, $162d_4$, $162d_5$, $162d_6$ collectively may span a length along the wall 102d in the first direction of greater than about fifty percent the length of the opening 108 in the wall 102d.

The RF shutter pieces $162d_1$, $162d_2$, $162d_3$, $162d_4$, $162d_5$, $162d_6$ may reduce the amount of deposition that occurs within the opening 108 of the chamber because the RF shutter pieces $162d_1$, $162d_2$, $162d_3$, $162d_4$, $162d_5$, $162d_6$ may alter the flow of the plasma as it creeps through the chamber 100. In one embodiment, the RF shutter pieces $162d_1$, $162d_2$, $162d_3$, $162d_4$, $162d_5$, $162d_6$ may comprise one continuous piece of material that spans the length of the wall 102d. In another embodiment, each of the RF shutter pieces $162d_1$, $162d_2$, $162d_3$, $162d_4$, $162d_5$, $162d_6$ and the wall 102d may collectively comprise a unitary piece of material. In another embodiment, the RF shutter pieces $162d_1$, $162d_2$, $162d_3$, $162d_4$, $162d_5$, $162d_6$ may be coupled with the wall 102d.

In the embodiment where the RF shutter pieces $162d_1$, $162d_2$, $162d_3$, $162d_4$, $162d_5$, $162d_6$ are a series of individual pieces, the plasma generated during the PECVD process may have its flow altered as it meets the RF shutter pieces $162d_1$, $162d_2$, $162d_3$, $162d_4$, $162d_5$, $162d_6$. The individual RF shutter pieces $162d_1$, $162d_2$, $162d_3$, $162d_4$, $162d_5$, $162d_6$ may reduce the ability of the plasma to flow below the level of the RF shutter pieces $162d_1$, $162d_2$, $162d_3$, $162d_4$, $162d_5$, $162d_6$. By reducing the amount of plasma that creeps below the level of the RF shutter pieces $162d_1$, $162d_2$, $162d_3$, $162d_4$, $162d_5$, $162d_6$, the amount of deposition that may occur below the level of the RF shutter pieces $162d_1$, $162d_2$, $162d_3$, $162d_4$, $162d_5$, $162d_6$, such as on the RF shutter pieces $162d_1$, $162d_2$, $162d_3$, $162d_4$, $162d_5$, $162d_6$ or within the opening 108, may be reduced. By reducing the amount of deposition below the level of the RF shutter pieces, $162d_1$, $162d_2$, $162d_3$, $162d_4$, $162d_5$, $162d_6$, flaking may also be reduced.

Figure 4:
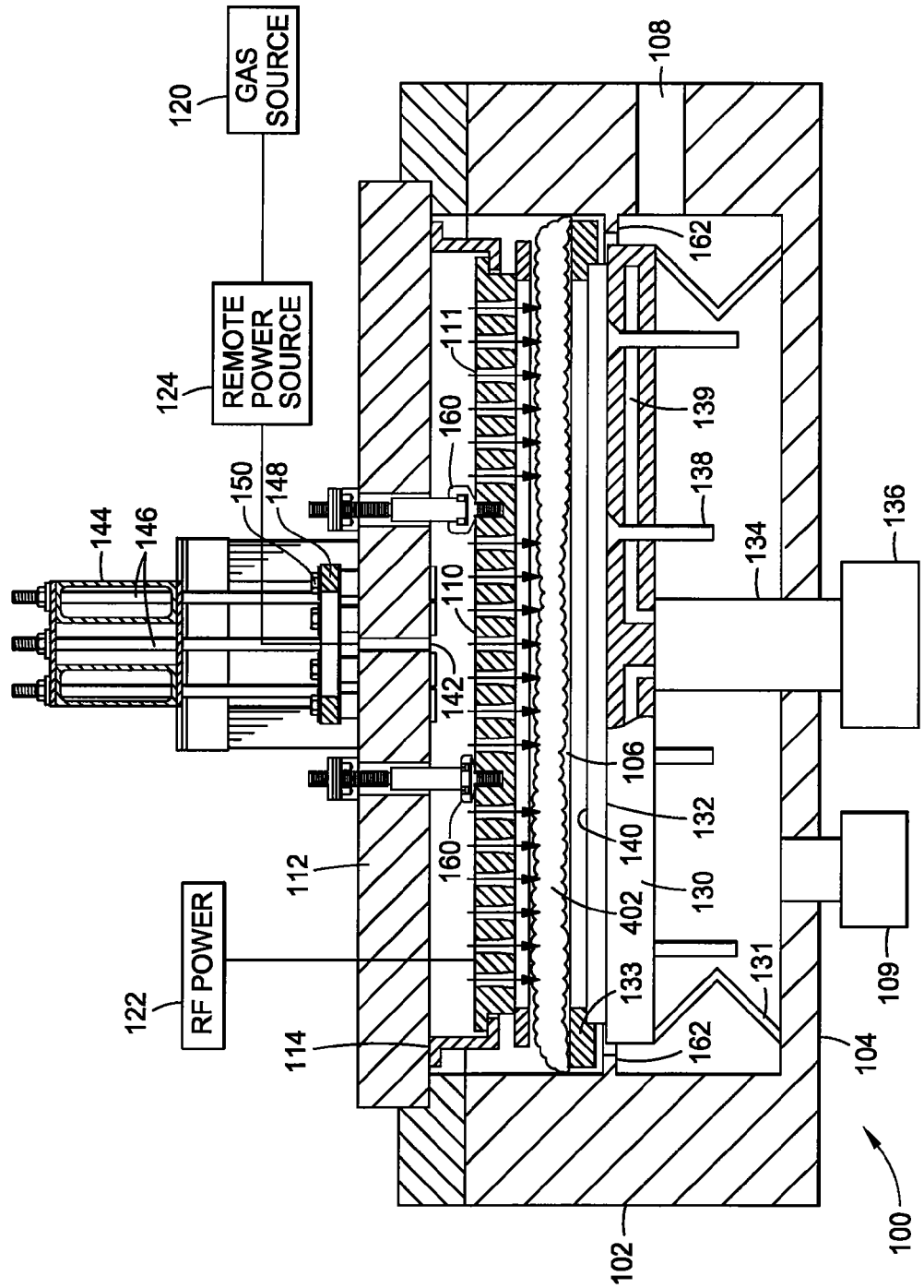
FIG. 4 is a cross sectional view of the processing chamber of FIG. 1 with the substrate raised to a processing position.

FIG. 4 is a cross sectional view of the processing chamber of FIG. 1 with the substrate raised to a processing position. As shown in FIG. 4, the RF shutter 162 may alter the flow of the plasma 402 so that the amount of plasma that creeps below the level of the RF shutters 162 may be reduced.

Figure 5A:
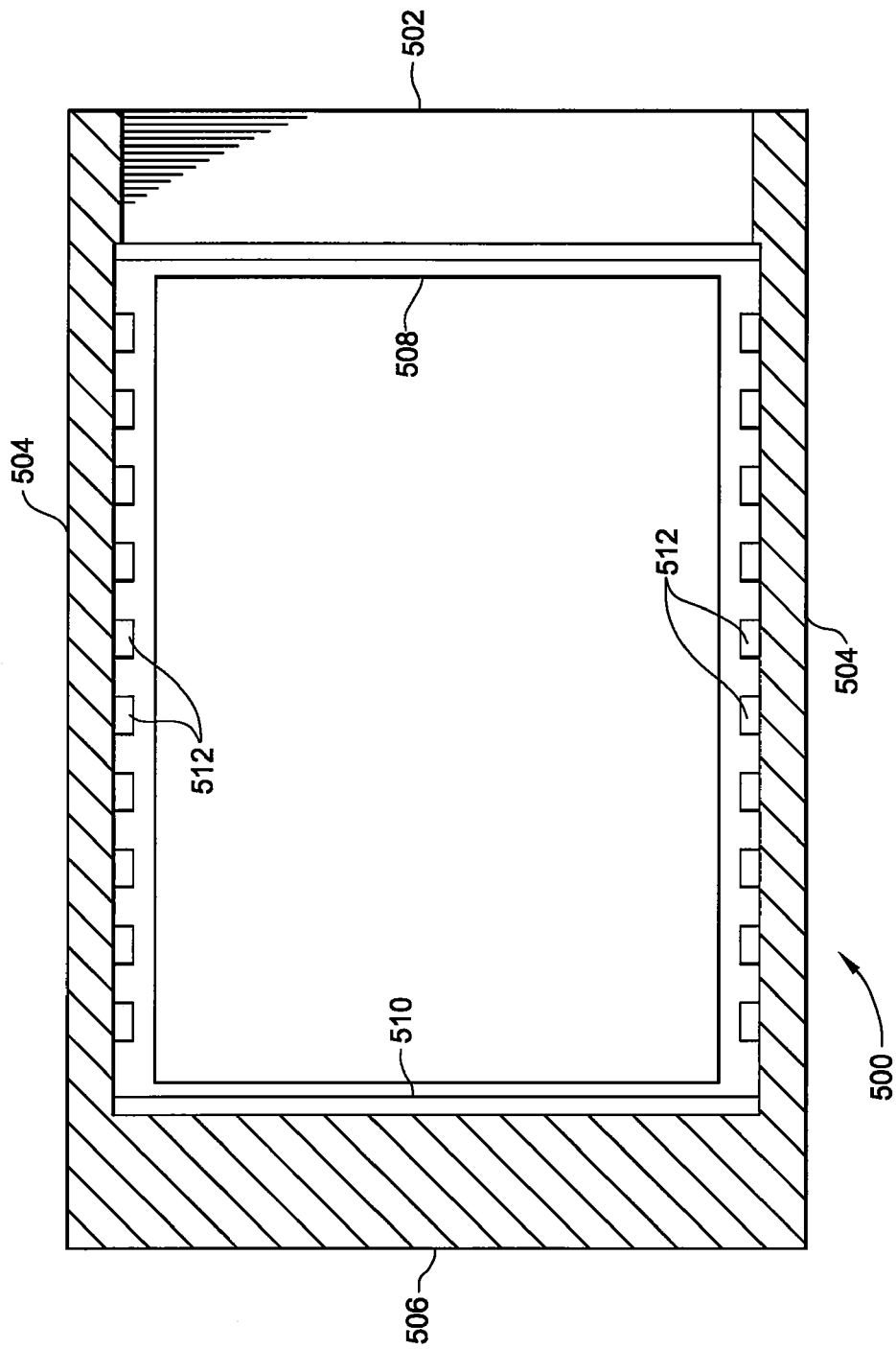
FIG. 5A is a top view of an apparatus having an RF shutter according to another embodiment of the invention.
Figure 5B:
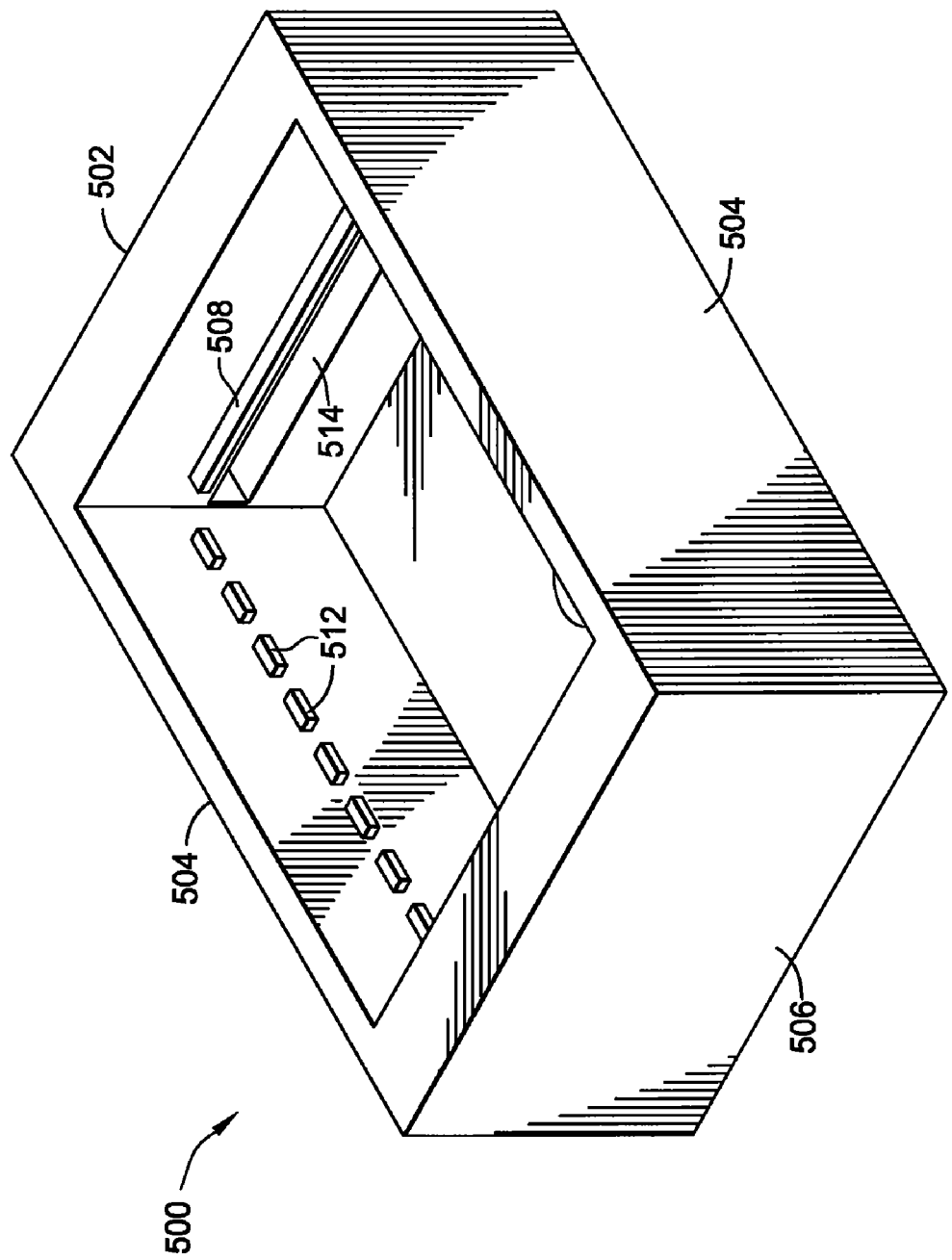
FIG. 5B is a perspective view of the RF shutter of FIG. 5A.

FIG. 5A is a top view of an apparatus 500 having an RF shutter according to another embodiment of the invention. FIG. 5B is a perspective view of the RF shutter of FIG. 5A. The apparatus 500 has a slit valve opening 514 in one chamber wall 502. Above the slit valve opening 514, an RF shutter 508 may be disposed. As shown in FIGS. 5A and 5B, the RF shutter 508 over the slit valve opening 514 may comprise a single piece of material. Along the wall 506 opposite to the slit valve opening 514, another RF shutter 510 may be present. The RF shutter 510 may be substantially identical to the RF shutter 508 above the slit valve opening 514.

The RF shutters 512 on the walls 504 adjacent to the slit valve opening 514, however, may be different than the RF shutter 508 above the slit valve opening 514. As shown in FIGS. 5A and 5B, one or more RF shutters 512 may be present that individually do not span the entire length of the wall 504. In one embodiment, the space between the individual RF shutters 512 may have a length substantially equal to or less than the length of the RF shutters 512. In another embodiment, the RF shutters 512 on opposite walls 504 may be substantially aligned. In another embodiment, the RF shutters 512 on opposite walls 504 may be substantially misaligned. The RF shutters 508, 510, 512 may all be disposed within the apparatus at substantially the same elevation relative to the slit valve opening 514. Thus, the RF shutters on opposite walls may be substantially identical while the RF shutters on adjacent walls may be substantially different. The RF shutters 508, 510, 512 may have a thickness between about 0.5 inches and about 4 inches. The RF shutters 512 may have a length between about 1 inch and about 12 inches.

Figure 6:
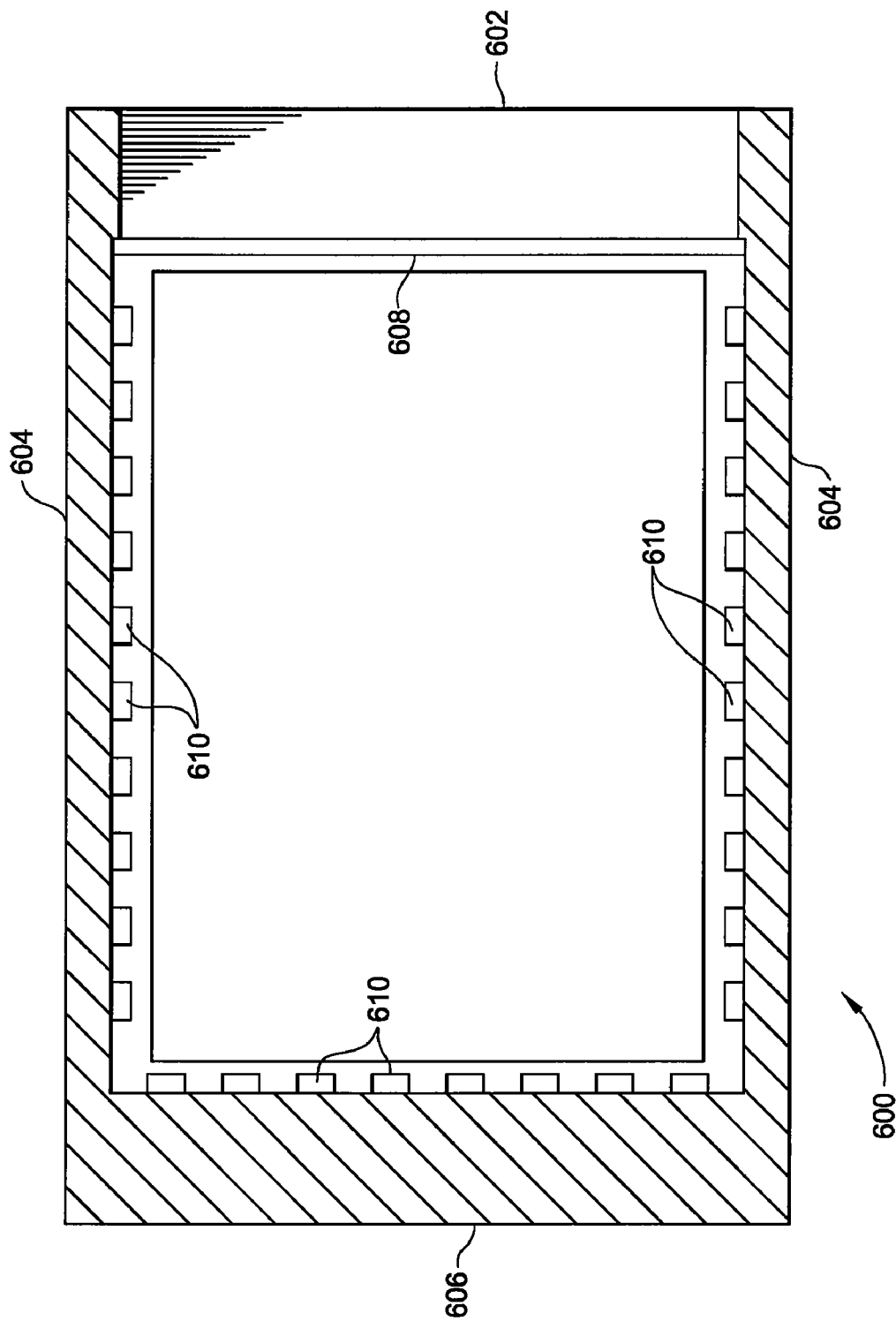
FIG. 6 is a top view of an apparatus having an RF shutter according to another embodiment of the invention.

FIG. 6 is a top view of an apparatus 600 having an RF shutter according to another embodiment of the invention. The apparatus 600 has a wall 602 on the side of the chamber having a slit valve opening. Above the slit valve opening, an RF shutter 608 may be disposed. The RF shutter 608 over the slit valve opening may comprise a single piece of material.

Along the wall 606 opposite to the slit valve opening and the walls 604 adjacent to the slit valve opening, more RF shutters 610 may be present. The RF shutters 610 on the walls 604, 606, however, may be different than the RF shutter 608 above the slit valve opening. One or more RF shutters 610 may be present that individually do not span the entire length of the wall 604, 606. In one embodiment, the space between the individual RF shutters 610 may have a length substantially equal to or less than the length of the RF shutters 610. In another embodiment, the RF shutters 610 on opposite walls 604 may be substantially aligned. In another embodiment, the RF shutters 610 on opposite walls 604 may be substantially misaligned. The RF shutters 608, 610 may all be disposed within the apparatus at substantially the same elevation relative to the slit valve opening. Thus, there are three walls 604, 606 that have staggered RF shutters 610 along the walls 604, 606 while the wall 602 having the slit valve opening therethrough may have a single RF shutter 608 spanning the length of the wall 602. The RF shutters 608, 610 may have a thickness between about 0.5 inches and about 4 inches. The RF shutters 610 may have a length between about 1 inch and about 12 inches.

By altering the flow of plasma within a processing chamber during plasma processing, RF shutters may reduce the amount of plasma creep that occurs into the lower areas of the processing chamber. By reducing the amount of plasma creep, the amount of undesired deposition may be reduced and hence, the likelihood of flaking that contaminates the substrate may be reduced.

While the foregoing is directed to embodiments of the present invention, other and further embodiments of the invention may be devised without departing from the basic scope thereof, and the scope thereof is determined by the claims that follow.

The invention claimed is:

1. A processing apparatus, comprising:
a chamber body having an interior defined by a plurality of walls, at least one wall having an opening therethrough that extends a first distance;
a first RF shutter extending from a first wall and having a continuous length that is equal to the length of the first wall;
a second RF shutter extending from a second wall and having a length less than the length of the second wall; and
a third RF shutter extending from the second wall having a length that is less than the length of the second wall.

2. The apparatus of claim 1, wherein the first wall has the opening therethrough.

3. The apparatus of claim 1, wherein the second wall is disposed opposite to the first wall.

4. The apparatus of claim 3, further comprising:
a fourth RF shutter extending from a third wall and having a length substantially equal to the length of the third wall; and
a fifth RF shutter extending from a fourth wall having a length that is substantially equal to the length of the fourth wall.

5. The apparatus of claim 4, wherein the second RF shutter and the third RF shutter are substantially identical.

6. The apparatus of claim 5, wherein the third wall and the fourth wall are parallel to each other and adjacent to the first wall and the second wall.

7. The apparatus of claim 1, wherein the second wall is disposed adjacent to the first wall.

8. The apparatus of claim 7, further comprising:
a fourth RF shutter extending from a third wall and having a length less than the length of the third wall; and
a fifth RF shutter extending from the third wall having a length that is less than the length of the third wall.

9. The apparatus of claim 8, further comprising:
a sixth RF shutter extending from a fourth wall and having a length less than the length of the fourth wall; and
a seventh RF shutter extending from the fourth wall having a length that is less than the length of the fourth wall.

10. The apparatus of claim 9, wherein the second RF shutter, the third RF shutter, and fourth RF shutter, the fifth RF shutter, the sixth RF shutter, and the seventh RF shutter are substantially identical.

11. The apparatus of claim 1, further comprising:
a shadow frame movable between a first position coupled with the first, second, and third RF shutters, and a second position uncoupled from the first, second, and third RF shutters.

12. The apparatus of claim 1, wherein the apparatus comprises a plasma enhanced chemical vapor deposition apparatus or a physical vapor deposition apparatus.

* * * * *